United States Patent
Liu et al.

(10) Patent No.: US 10,970,167 B2
(45) Date of Patent: *Apr. 6, 2021

(54) MEMORY DEVICE

(71) Applicant: Taiwan Semiconductor Manufacturing Co., Ltd., Hsinchu (TW)

(72) Inventors: Chien-Yin Liu, Hsinchu (TW); Yu-Der Chih, Hsin-Chu (TW); Hsueh-Chih Yang, Hsinchu (TW); Jonathan Tehan Chen, Hsinchu (TW); Kuan-Chun Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/743,445

(22) Filed: Jan. 15, 2020

(65) Prior Publication Data

US 2020/0151057 A1 May 14, 2020

Related U.S. Application Data

(63) Continuation of application No. 15/965,883, filed on Apr. 28, 2018, now Pat. No. 10,599,517.

(Continued)

(51) Int. Cl.
| | |
|---|---|
| *G11C 29/00* | (2006.01) |
| *G06F 11/10* | (2006.01) |
| *G11C 16/26* | (2006.01) |
| *G11C 29/42* | (2006.01) |
| *G11C 29/52* | (2006.01) |

(Continued)

(52) U.S. Cl.
CPC ...... *G06F 11/1068* (2013.01); *G06F 11/1012* (2013.01); *G06F 11/1056* (2013.01); *G11C 16/26* (2013.01); *G11C 29/42* (2013.01); *G11C 29/52* (2013.01); *G11C 11/5628* (2013.01); *G11C 11/5642* (2013.01); *G11C 2029/0411* (2013.01)

(58) Field of Classification Search
None
See application file for complete search history.

(56) References Cited

U.S. PATENT DOCUMENTS

| | | | |
|---|---|---|---|
| 10,599,517 B2 * | 3/2020 | Liu | G11C 16/26 |
| 2007/0061503 A1 | 3/2007 | Chiang et al. | |

(Continued)

FOREIGN PATENT DOCUMENTS

KR 20160058953 5/2016

*Primary Examiner* — Guerrier Merant
(74) *Attorney, Agent, or Firm* — Duane Morris LLP

(57) ABSTRACT

A method includes: retrieving a first word comprising a plurality of data bits and a plurality of parity bits that correspond to the first word, wherein the plurality of data bits form N−1 groups and the plurality of parity bits form a first group different from the N−1 groups, and N is a positive integer greater than 2; receiving a request to update respective data bits of a first one of the N−1 groups; and providing a second word comprising updated data bits that form a second one of the N−1 groups and a plurality of updated parity bits that correspond to the second word, wherein the plurality of updated parity bits form a second group that has a same group index as the first one of the N−1 groups.

20 Claims, 6 Drawing Sheets

Related U.S. Application Data

(60) Provisional application No. 62/592,189, filed on Nov. 29, 2017.

(51) Int. Cl.
*G11C 29/04* (2006.01)
*G11C 11/56* (2006.01)

(56) References Cited

U.S. PATENT DOCUMENTS

| | | |
|---|---|---|
| 2016/0162359 A1 | 6/2016 | Kittner |
| 2016/0246537 A1 | 8/2016 | Kim |
| 2017/0131907 A1 | 5/2017 | Klemm et al. |
| 2017/0286216 A1 | 10/2017 | Kozhikkottu |

* cited by examiner

Figure 3E

| Group Index: | 4 | 3 | 2 | 1 | 0 |
|---|---|---|---|---|---|
| | 1111−p[15:0] / 1000−d[63:48] | 0001−d[15:0] / 0100−d[47:32] | | | 0010−d[31:16] |

| Group Index: | 4 | 3 | 2 | 1 | 0 |
|---|---|---|---|---|---|
| 1000−d[63:48] | 0001−d[15:0] / 0100−d[47:32] | | 1111−p[15:0] | 0010−d[31:16] |

308 — 304' — 306 — 310' — 302

MEMORY DEVICE

CROSS-REFERENCE TO RELATED APPLICATION

This application is a continuation application of U.S. patent application Ser. No. 15/965,883, filed Apr. 28, 2018, which claims priority to U.S. Provisional Patent Application No. 62/592,189, filed on Nov. 29, 2017, which is incorporated by reference herein in its entirety.

BACKGROUND

An Error Correction Code (ECC)-enabled memory device is generally referred to a memory device that includes additional information, called ECC (Error Correction Code) bits (which are typically referred to as "parity bits"), stored in the memory device in addition to actual data bits. Such parity bits are used to check consistency of the data bits when the data bits are read from the memory device. In general, using the parity bits, corruption (e.g., errors) of data bits can be detected and the corrupted data bits can be corrected.

In such an ECC-enabled memory device, the parity bits are typically generated through an ECC engine to be associated with the corresponding data bits. For example, to detect or correct errors of a data word having N data bits, M bits of parity bits are generated to be associated with the N data bits. As such, the number of cells in the memory device that are used to store the N data bits is N+M bits. In response to a write access to the ECC-enabled memory device (i.e., writing a plurality of data bits to the memory device), corresponding parity bits will be computed and written to the memory device along with the plurality of data bits. When the plurality of data bits are read, consistency of data bits is checked using the corresponding parity bits, and any data error, if present, may be accordingly corrected.

In various applications, while updating the N data bits, instead of updating all N bits, there may be plural partial-write cycles, each of which is configured to update a corresponding subset of the N data bits, performed to update the whole N data bits. In an example where the above-mentioned data word has 64 data bits (N=64), there may be a total of 4 partial-write cycles performed to update the total of 64 data bits. Every time when the partial-write cycle is performed the update the corresponding subset of data bits, a corresponding set of parity bits are generated (e.g., updated). In accordance with the 4 partial-write cycles, the corresponding sets of parity bits are repeatedly written to same cells of the memory device, which disadvantageously impacts respective endurances of the cells that present the parity bits. Thus, existing techniques to perform partial-write cycles in the ECC-enabled memory device are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

FIGS. 3A, 3B, 3C, 3D, 3E, and 3F respectively illustrate symbolic diagrams of words being partially updated using the method of FIG. 2, in accordance with some embodiments.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

The present disclosure provides various embodiments of an ECC-enabled memory device including a control logic circuit that is configured to dynamically change respective cells of the memory device to present parity bits during each partial-write cycle. In some embodiments, the control logic circuit is configured to update a subset of a first data word present in the memory device by providing a second data word. More specifically, each of the first and second data words have a plurality of subsets that each has a plurality of data bits, and at least one corresponding subset of parity bits. In some embodiments, the control logic circuit is configure to assign a group index of the subset of parity bits of the second data word as a group index of the to-be updated subset of the first data word, and assign a group index of a subset of the second data word containing updated bits as a group index of the subset of the parity bits of the first data word. As such, over plural partial-write cycles, the cells that are to be written with the parity bits can be changed, which advantageously increases respective endurances of such cells.

Figure 1:
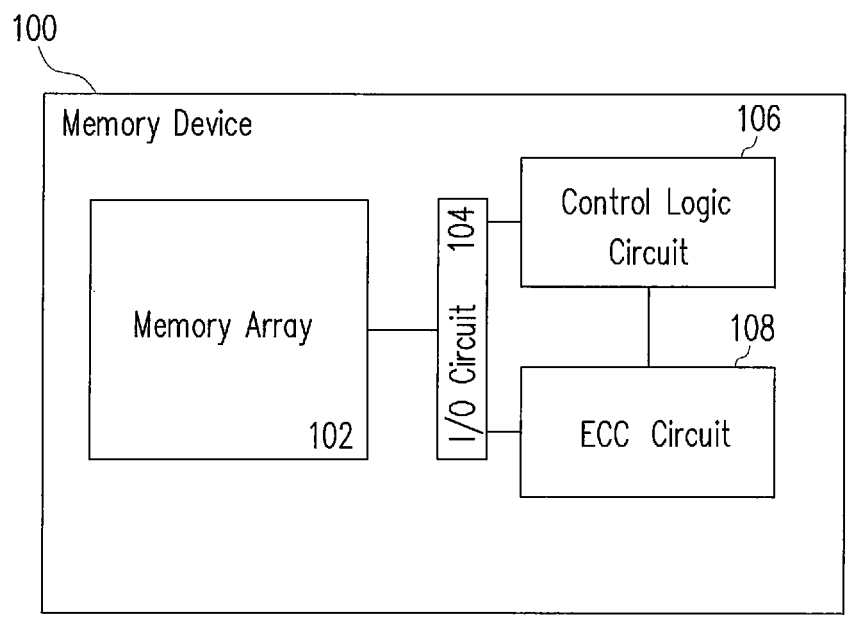
FIG. 1 illustrates a block diagram of a memory device, in accordance with some embodiments.

FIG. 1 illustrates an exemplary block diagram of a memory device 100, in accordance with various embodiments of the present disclosure. The memory device 100 includes a memory array 102, an input/output (I/O) circuit 104, a control logic circuit 106, and an Error Correction Code (ECC) circuit 108. In some embodiments, the components of the memory device 100 (e.g., the memory array 102, the I/O circuit 104, the control logic circuit 106, the ECC circuit 108, etc.) are coupled to one another.

In some embodiments, the memory array 102 includes a plurality of memory cells, or cells, arranged as an array, wherein the cells may each be a non-volatile memory (NVM) cell such as, for example, a ferroelectric random access memory (FRAM) cell, a resistive RAM (RRAM) cell, a magnetoresistive RAM (MRAM) cell, etc. In some embodiments, each of the plurality of memory cells is configured to be written and read, which will be discussed in further detail below. The I/O circuit 104, which includes a plurality of drivers (e.g., word line drivers, bit line drivers, etc.), sensing circuits (e.g., sensing amplifiers. etc.), and other logic circuits (e.g., transmission gates, switches, multiplexers, etc.), is configured to access the plurality of memory cells of the memory array 102. The control logic circuit 106 is configured to control the I/O circuit 104 to write data bits into respective cells of the memory array 102 and read the data bits present by the respective cells of the memory array 102. The ECC circuit 108 is configured to generate one of various ECC's (e.g., Hamming codes, Hsiao codes, Reed-Solomon codes, Bose-Chaudhuri-Hocquenghem codes, Turbo codes, Low-Density-Parity Check codes) based on data bits to be written into the memory array 102 and use such an ECC to detect error(s) of the data bits when reading the data bits from the memory array 102 and further correct such error(s), if needed.

Figure 2:
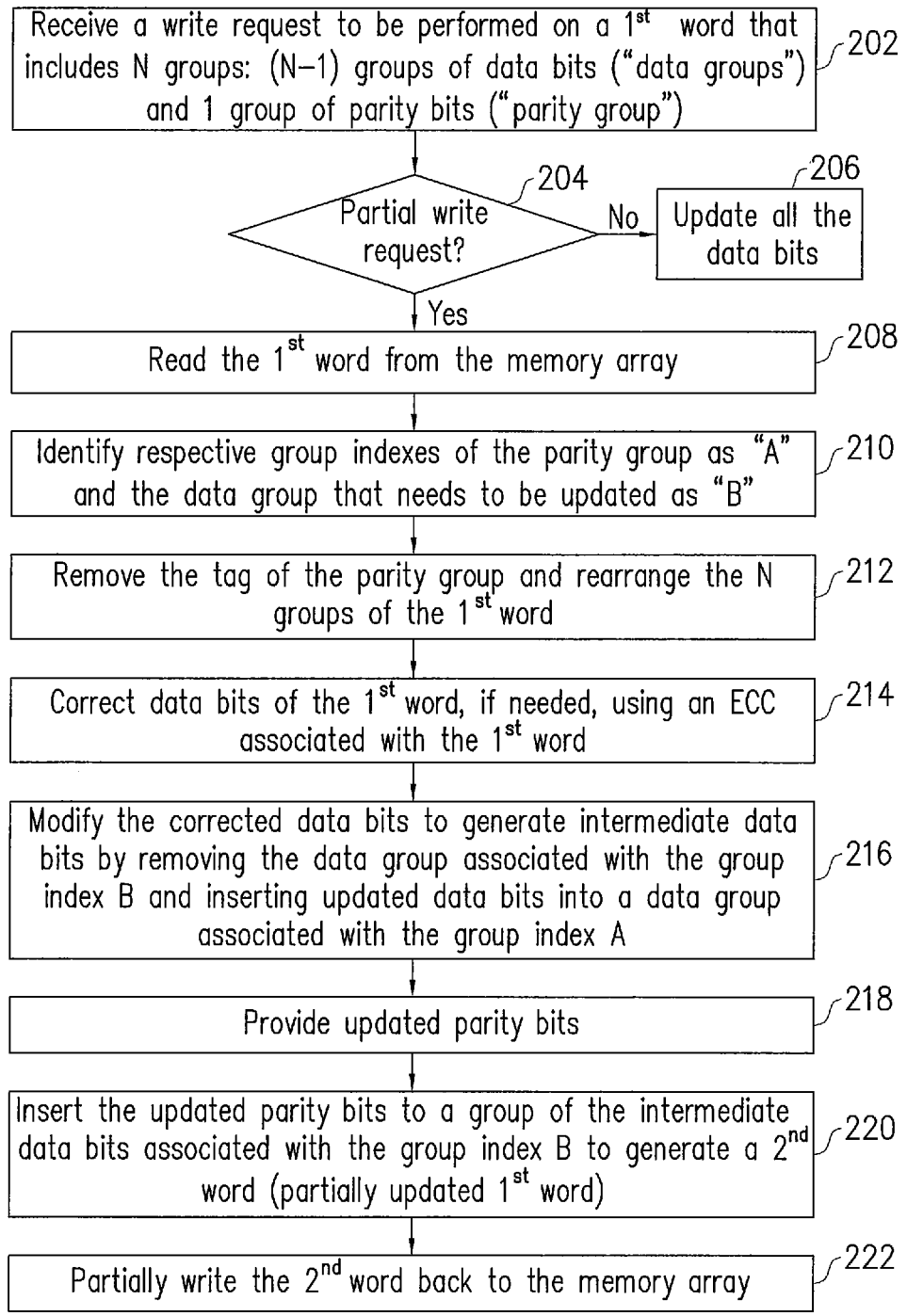
FIG. 2 illustrate a flow chart of an exemplary method to operate the memory device, in accordance with some embodiments.

FIG. 2 illustrates a flow chart of an exemplary method 200 to operate the memory device 100, in accordance with various embodiments. In various embodiments, the operations of the method 200 are performed by the respective components illustrated in FIG. 1. For purposes of discussion, the following embodiment of the method 200 will be described in conjunction with the above FIG. 1 and the following FIGS. 3A, 3B, 3C, 3D, 3E, and 3F, which symbolically illustrate words at various operation stages of the method 200, respectively. The illustrated embodiment of the method 200 is merely an example. Therefore, it should be understood that any of a variety of operations of the method 200 may be omitted, re-sequenced, and/or added while remaining within the scope of the present disclosure.

The method 200 starts with operation 202 in which a write request to be performed on a first word, including (N−1) groups of data bits and 1 group of parity bits, is received. In some embodiments, the (N−1) groups of data bits each has a evenly-divided number of data bits of a data word, and the group of parity bits also has the same number of parity bits. For example, when a data word has 64 data bits, there may be 4 groups of data bits, each of which has 16 data bits, and corresponding to the data word having 64 data bits, there may be 1 additional group having 16 parity bits, which collectively form the first word having 80 data or parity bits. In some alternative embodiments, the respective numbers of data bits of the (N−1) groups may be different from each other while remaining within the scope of the present disclosure. For purposes of clarity of explanation, each of the (N−1) groups of data bits and the 1 group of parity bits are herein referred to as a "data group" and "parity group," respectively.

In some embodiments, the 16 parity bits are generated based on the data word by the ECC circuit 108 as one of various above-mentioned ECC codes. Continuing with the above example, such a first word, including the 4 data groups and parity group (which will be symbolically illustrated in FIGS. 3A-3F), may be present by (e.g., previously written into) respective cells of the memory array 102, and the write request to update the first word may be received by the control logic circuit 106, in accordance with some embodiments.

The method 200 continues to operation 204 in which the write request is determined to be whether a partial write request or not. If not (i.e., the write request is not a partial write request), the method 200 proceeds to operation 206 in which all the data bits of the first word will be updated; and if yes (i.e., the write request is a partial write request), the method 200 proceeds to the following operations 208 to 222 to partially update the data bits of the first word, which will be discussed below. In accordance with some embodiments, in operation 206, the control logic circuit 106 may first cause the I/O circuit 104 to read out the first word from the respective cells of the memory array 102, decode the first word through the ECC circuit 108 to retrieve correct, or corrected, data bits of the first word, update all the correct(ed) data bits, and cause the I/O circuit 104 to write the correct(ed) data bits into the respective cells of the memory array 102.

On the other hand, the method 200 continues to operation 208 in which the first word is read from the memory array. In some embodiments, the control logic circuit 106 may cause the I/O circuit 104 to read out the first word from the memory array 102. For example, the control logic circuit 106 may cause a read driver of the I/O circuit 104 to assert a WL along which the cells present (e.g., store) the first word, and then cause sensing amplifiers of the I/O circuit 104 that are respectively coupled to the cells to read out the first word. For purposes of clarity, the above-mentioned read driver, WL, and sensing amplifiers are not shown in the figures of the present disclosure.

Figure 3A:
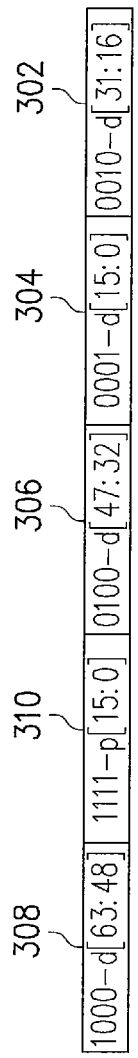

Referring to FIG. 3A, a symbolic diagram of the first word, corresponding to the operation 208 of the method 200, is provided as an example. As illustrated, the first word includes 4 data groups: 302, 304, 306, and 308, and 1 parity group: 310, wherein each of the data/parity groups is associated with a group index, which will be discussed in further detail below with respect to operation 210 of the method 200. In some embodiments, each of the data groups 302, 304, 306, and 308 includes a plurality of data bits, and similarly, the parity group 310 includes a plurality of parity bits. Further, a corresponding data tag is associated with each of the data groups 302, 304, 306, and 308, and a corresponding parity tag is associated with the parity group 310.

For example, the data group 302 includes 16 data bits, which are collectively shown as "d[31:16]" in FIG. 3A, and the data group 302 is associated with a data tag having 4 bits, which are shown as "0010" in FIG. 3A; the data group 304 includes 16 data bits, which are collectively shown as "d[15:0]" in FIG. 3A, and the data group 304 is associated with a data tag having 4 bits, which are shown as "0001" in FIG. 3A; the data group 306 includes 16 data bits, which are collectively shown as "d[47:32]" in FIG. 3A, and the data group 306 is associated with a data tag having 4 bits, which are shown as "0100" in FIG. 3A; the data group 308 includes 16 data bits, which are collectively shown as "d[63:48]" in FIG. 3A, and the data group 308 is associated with a data tag having 4 bits, which are shown as "1000" in FIG. 3A; the parity group 310 includes 16 parity bits, which are collectively shown as "p[15:0]" in FIG. 3A, and the parity group 310 is associated with a parity tag having 4 bits, which are shown as "1111" in FIG. 3A.

In some embodiments, each bit of the data bits of the data groups, parity bits of the parity group, data tag, and parity tag is configured to be present by a corresponding cell of the memory array 102. In some embodiments, the data tag and the parity tag have respective different "bit structures" to allow the control logic circuit 106 to differentiate the parity tag from the data tag(s). More specifically, over the 4 bits of the data tags 0010, 0001, 0100, and 1000, each data tag has at most one logic 1; and on the other hand, over the 4 bits of the parity tag 1111, the parity tag has a number of logic 1 that is more than one plus a maximum allowed error bits. For example, when a maximum allowed error bits is two, the parity tag 1111 is configured to have a number of logic 1 that is more than three (i.e., 1+2). As such, even though the parity tag has two error bits, e.g., 1100, the control logic circuit 106 can still differentiate the parity tag from all the other data tags since the data tags cannot have more than one logic 1.

The method 200 continues to operation 210 in which respective group indexes of the parity group and data group that is configured to be updated are identified as "A" and "B," respectively. As mentioned above, in some embodiments, each of the fata/parity groups is associated with a group index. Referring again to FIG. 3A, when the first word is read from the memory array 102, the data/parity groups 302-310 of the first word are arranged as shown. In some embodiments, the control logic circuit 106 may record the respective group indexes of the data/parity groups 302, 304, 306, 308, and 310, which may be pre-defined or assigned by the control logic circuit 106. For example, the data group 302 is associated with a group index 0; the data group 304 is associated with a group index 1; the data group 306 is associated with a group index 2; the parity group 310 is associated with a group index 3; and the data group 308 is associated with a group index 4. The control logic circuit 106 may record such group indexes of the data/parity groups 302-310 of the first word.

In an example where the control logic circuit 106 is configured to update the data bits of the data group 304 (i.e., d[15:0]), the control logic circuit 106 may record the value of "B" as 1 (since the group index of the data group 304 is 1). And since the parity group 310 is associated with the group index 3, which can be differentiated by its parity tag as mentioned above, the control logic circuit 106 may record the value of "A" as 3. In some embodiments, the control logic circuit 106 may use such values of A and B to change the cells of the memory array 102 to present updated parity bits, which will be discussed below.

Figure 3B:
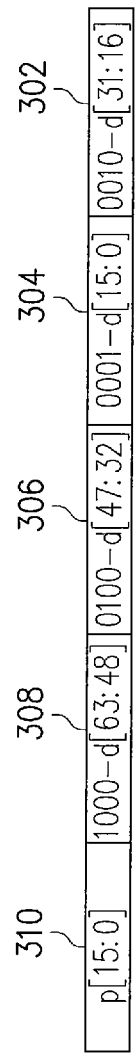
Figure 3C:
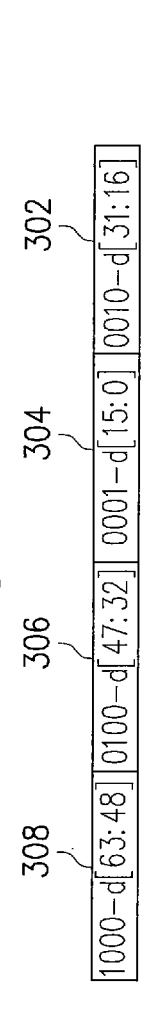
Figure 3D:
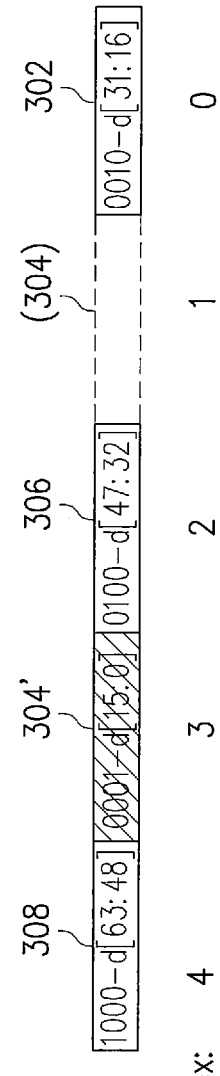

The method 200 continues to operation 212 in which the tag of the parity group is removed and the N groups of first word are rearranged. Referring to FIG. 3B, a symbolic diagram of the first word, corresponding to the operation 212 of the method 200, is provided as an example. As shown, the parity tag "1111" of the parity group 310 is removed, and the (N−1) data groups 302 to 308 and the parity group 310 (i.e., the N groups of the first word) are rearranged.

The method 200 continues to operation 214 in which the data bits of the first word are corrected, if needed, using an ECC associated with the first word. In some embodiments, after the control logic circuit 106 reads out and rearranges the first word from the memory array 102 (as shown in FIG. 3B), the control logic circuit 106 may provide the rearranged first word to the ECC circuit 108 to check whether there is any error data bit present in the read/rearranged first word (i.e., the (N−1) groups of data bits 302 to 308) by using the group of parity bits 308 (i.e., an ECC associated with the first word). If so, the ECC circuit 108 may correct such error data bit(s) and provide corrected data bits of the first word to the control logic circuit 106; and if not, the ECC circuit 108 may provide the data bits, as received, to the control logic circuit 106, either of which is symbolically shown as "checked" or "correct(ed)" data bits in FIG. 3C.

The method 200 continues to operation 216 in which the correct(ed) data bits are modified to generate intermediate data bits by removing the data group associated with the group index B and inserting updated data bits into a data group associated with the group index A. Continuing with the above example where the values of A and B are recorded, by the control logic circuit 106, as 3 and 1, respectively, a symbolic diagram of such intermediate data bits, corresponding to the operation 216 of the method 200, is provided as an example in FIG. 3D. As shown, the intermediate data bits do not include the data group associated with the group index of 1 (outlined by dotted lines), i.e., the data group 304 containing "old" data bits. However, the intermediate data bits includes data bits updated from the old data bits of the data group 304, which are inserted into a group associated with the group index of 3 (filled with diagonal stripes). More specifically, in some embodiments, the control logic circuit 106 removes the data bits of the group with the group index of 1 (group 304) from the corrected data bits (FIG. 3C), updates the data bits in the group 304, and then inserts such updated group 304' into a location with the group index of 3 to provide the intermediate data bits.

The method 200 continues to operation 218 in which updated parity bits are provided. In some embodiments, after the control logic circuit 106 retrieves the intermediate data bits (FIG. 3D), the control logic circuit 106 may provide the intermediate data bits to the ECC circuit 108 to generate the updated parity bits (i.e., an updated ECC code) associated with the intermediate data bits that includes the updated data bits (the data bits of the group 304'). Such updated parity bits, which may form a parity group 310' as symbolically illustrated in FIG. 3E. As mentioned above, the updated parity bits are generated based on the corresponding data bits, i.e., the intermediate data bits, which can be one of the Hamming codes, Hsiao codes, Reed-Solomon codes, Bose-Chaudhuri-Hocquenghem codes, Turbo codes, and Low-Density-Parity Check codes.

The method 200 continues to operation 220 in which the updated parity bits are inserted to a group of the intermediate data bits associated with the group index B to generate a second word (or a partially updated first word). Continuing with the above example, the control logic circuit 106 records the value of B as 1 (operation 210) so the updated parity bits, which form the group 310', are inserted, by the control logic circuit 106, into the group with the group index of 1 to generate the second word, as symbolically illustrated in FIG. 3F.

The method 200 continues to operation 222 in which the second word are partially written back to the memory array. As mentioned above, the data bits (i.e., the groups 302 to 308) and parity bits (i.e., the group 310) of the first word, configured to be updated, are read from the respective cells of the memory array 102 (FIG. 3A). In some embodiments, after the control logic circuit 106 generates the second word (FIG. 3F), the control logic circuit 106 may follow the data structure of the second word to write the group containing the updated data bits and the group containing the updated parity bits back into the cells of the memory array 102.

More specifically, upon receiving the request to partially update the first word, referring again to FIG. 3A, the data bits of the data group 302 are read out from a first plurality of cells of the memory array 102; the data bits of the data group 304 are read out from a second plurality of cells of the memory array 102; the data bits of the data group 306 are read out from a third plurality of cells of the memory array 102; the parity bits of the parity group 310 are read out from a fourth plurality of cells of the memory array 102; and the data bits of the data group 308 are read out from a fifth plurality of cells of the memory array 102. When partially writing the second word (the partially updated first word) back to the memory array 102, referring again to FIG. 3F, only the updated parity bits contained in the parity group 310' are written back into the second plurality of cells of the memory array 102 (which originally present the to-be updated data bits); and only the updated data bits contained in the data group 304' are written back into the fourth plurality of cells of the memory array 102 (which originally present the pre-updated parity bits). As such, every time when a partial-write cycle is performed (i.e., one group of a word is updated), the cells that are configured to present updated parity bits can be dynamically changed by swapping the cells presenting the to-be updated data bits with the cells presenting the pre-updated parity bits. Accordingly, when plural partial-write cycles are performed, the number of writing the cells can be more uniformly distributed, which may advantageously improve respective endurances of the cells.

Figure 4:
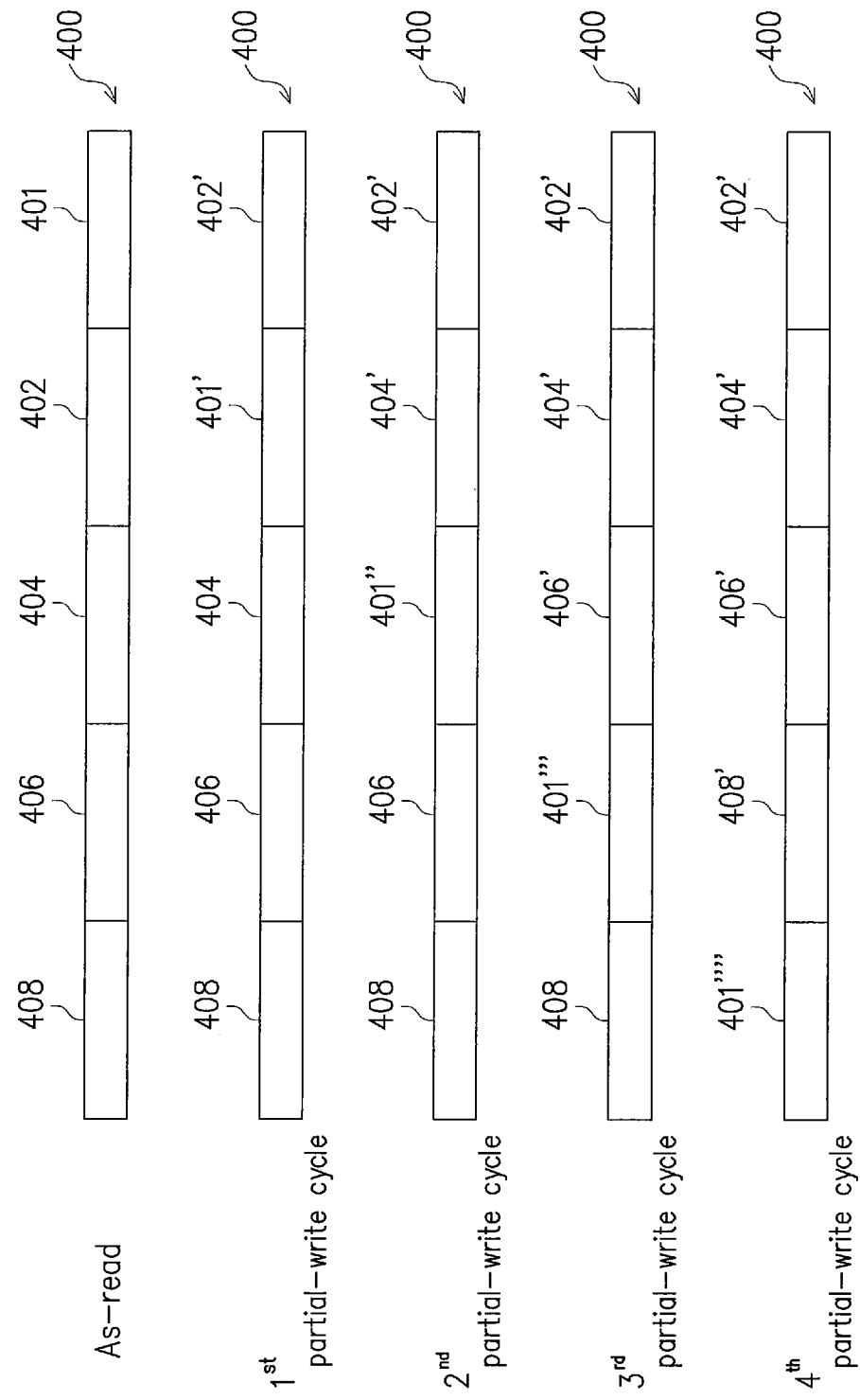
FIG. 4 illustrates respective symbolic diagrams of a word at various partial update stages, in accordance with some embodiments.

FIG. 4 illustrates respective symbolic diagrams of a word 400 at various partial update stages, in accordance with some embodiments. When the word 400 is read out from a memory array (shown as "As-read" in FIG. 4), the word 400 includes a parity group 401, a first data group 402, a second data group 404, a third data group 406, and a fourth data group 408, the data/parity bits of the data/parity groups 401-406 are present by respective cells of the memory array. For example, the parity bits of the parity group 401 are presented by a first plurality of cells; the data bits of the data group 402 are presented by a second plurality of cells; the data bits of the data group 404 are presented by a third plurality of cells; the data bits of the data group 406 are presented by a fourth plurality of cells; and the data bits of the data group 408 are presented by a fifth plurality of cells.

Following the above-discussed operation principle, when a first partial-write cycle (i.e., a first partial update) is performed on the word 400 (e.g., only the group of data bits 402 of the word 400 are to be updated), a location of a group containing the updated data bits, data group 402', is swapped to a location of the parity group 401, and a location of a group containing updated parity bits, parity group 401', is swapped to a location of the data group 402 that are configured to be updated. Alternatively stated, respective group indexes are swapped. As such, the updated data bits contained in the group 402' can be accordingly written to the first plurality of cells (instead of the second plurality of cells where the data bits of the data group 402 are read), and the updated parity bits contained in the parity group 401' can be accordingly written to the second plurality of cells (instead of the first plurality of cells where the parity bits of the parity group 401 are read).

Similarly, when a second partial-write cycle is subsequently performed on the word 400 (e.g., only the group of data bits 404 of the word 400 are to be updated), updated data bits contained in a data group 404' can be accordingly written to the second plurality of cells (instead of the third plurality of cells where the data bits of the data group 404 are read), and corresponding updated parity bits contained in a group 401" can be accordingly written to the third plurality of cells (instead of the second plurality of cells where the parity bits of the parity group 401' are read). When a third partial-write cycle is subsequently performed on the word 400 (e.g., only the data bits of the data group 406 of the word 400 are to be updated), updated data bits contained in a data group 406' can be accordingly written to the third plurality of cells (instead of the fourth plurality of cells where the data bits of the group 404 are read), and corresponding updated parity bits contained in a parity group 401''' can be accordingly written to the fourth plurality of cells (instead of the third plurality of cells where the parity bits of group 401" are read). When a fourth partial-write cycle is subsequently performed on the word 400 (e.g., only the data bits contained in the date group 408 of the word 400 are to be updated), updated data bits contained in a date group 408' can be accordingly written to the fourth plurality of cells (instead of the fifth plurality of cells where the data bits of the group 408 are read), and corresponding updated parity bits contained in a parity group 401"" can be accordingly written to the fifth plurality of cells (instead of the fourth plurality of cells where the parity bits of the parity group 401''' are read). As such, each of the first, second, third, fourth, and fifth pluralities of cells are evenly written twice over the 4 partial-write cycles.

Figure 5:
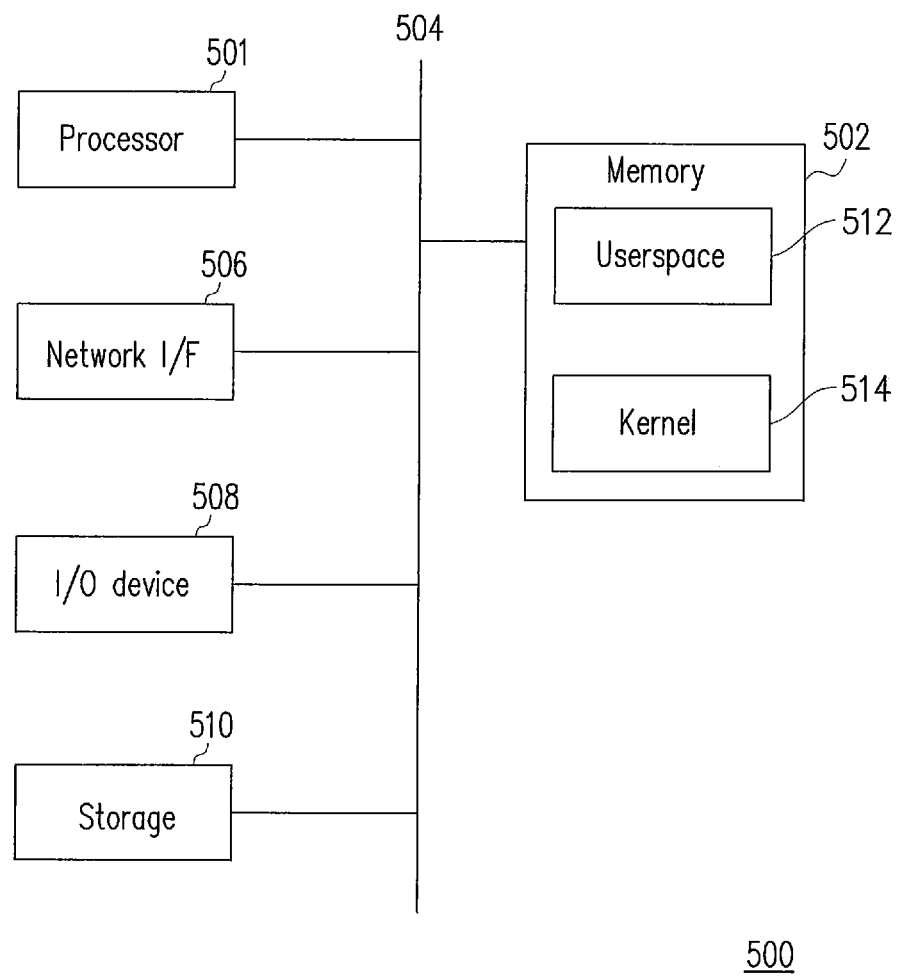
FIG. 5 illustrates a block diagram of a computer system to perform the method of FIG. 2, in accordance with some embodiments.

FIG. 5 is a block diagram of a computer system 500 in accordance with some embodiments. One or more of the tools and/or engines and/or systems and/or operations described with respect to FIGS. 1-4 is realized in some embodiments by one or more computer systems 500 of FIG. 5. The system 500 comprises at least one processor 501, a memory 502, a network interface (I/F) 506, an input/output (I/O) device 508, and a storage 510 communicatively coupled via a bus 504 or other interconnection communication mechanism.

The memory 502 comprises, in some embodiments, a random access memory (RAM) and/or other dynamic storage device and/or read only memory (ROM) and/or other static storage device, coupled to the bus 504 for storing data and/or instructions to be executed by the processor 501. The memory 502 can further include a userspace 512, kernel 514, portions of the kernel and/or the userspace, and components thereof. The memory 502 is also used, in some embodiments, for storing temporary variables or other intermediate information during execution of instructions to be executed by the processor 501. In various embodiments, the memory 502 can be contained within a single integrated circuit or comprise a plurality of discrete memory devices operatively coupled to one another.

In some embodiments, a storage device 510, such as a magnetic disk or optical disk, is coupled to the bus 504 for storing data and/or instructions. The I/O device 508 comprises an input device, an output device and/or a combined input/output device for enabling user interaction with the system 500. An input device comprises, for example, a keyboard, keypad, mouse, trackball, trackpad, and/or cursor direction keys for communicating information and commands to the processor 501. An output device comprises, for example, a display, a printer, a voice synthesizer, etc. for communicating information to a user.

In some embodiments, one or more operations and/or functionality of the tools and/or engines and/or systems described with respect to FIGS. 1-4 are realized by the processor 501, which is programmed for performing such operations and/or functionality. In some embodiments, the processor 501 is configured as specifically configured hardware (e.g., one or more application specific integrated circuits (ASICs)). In accordance with various embodiments, the processor 501 may be implemented within a single integrated circuit (IC) or as multiple communicatively coupled IC's and/or discrete circuits. It is appreciated that the processor 501 can be implemented in accordance with various known technologies. In one embodiment, the processor 501 includes one or more circuits or units configurable to perform one or more functions or processes described herein by executing instructions stored in an associated memory, for example. In other embodiments, the processor 501 may be implemented as firmware (e.g., discrete logic components) configured to perform one or more functions or processes described herein. For example, in accordance with various embodiments, the processor 501 may include one or more controllers, microprocessors, microcontrollers, application specific integrated circuits (ASICs), digital signal processors, programmable logic devices, field programmable gate arrays, or any combination of these devices or structures, or other known devices and structures, to perform the functions described herein.

One or more of the memory 502, the I/F 506, the storage 510, the I/O device 508, and the bus 504 is/are operable to receive instructions, data, design constraints, design rules, netlists, layouts, models and/or other parameters for processing by the processor 501.

In some embodiments, the operations and/or functionality are realized as functions of a program stored in a non-transitory computer readable recording medium. In at least one embodiment, the operations and/or functionality are realized as functions of a program, such as a set of executable instructions, stored in memory 502. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

In an embodiment, a method includes: retrieving a first word comprising a plurality of data bits and a plurality of parity bits that correspond to the first word, wherein the plurality of data bits form N−1 groups and the plurality of parity bits form a first group different from the N−1 groups, and N is a positive integer greater than 2; receiving a request to update respective data bits of a first one of the N−1 groups; and providing a second word comprising updated data bits that form a second one of the N−1 groups and a plurality of updated parity bits that correspond to the second word, wherein the plurality of updated parity bits form a second group that has a same group index as the first one of the N−1 groups.

In another embodiment, a method includes: reading a first word from a memory array, wherein the first word comprises a plurality of data bits that form N−1 groups and a plurality of parity bits, corresponding to the first word, that form a first group attached to the N−1 groups, and wherein the first group of parity bits and the N−1 groups of data bits are each associated with a group index and N is a positive integer greater than 2; receiving a partial-write request to update the data bits of a first one of the N−1 groups; providing a second word comprising updated data bits that form a second one of the N−1 groups and a plurality of updated parity bits, corresponding to the second word, that form a second group by corresponding group indexes of the second one of the N−1 groups and the second group to the group index of the first group of parity bits and the group index of the first one of the N−1 groups, respectively; and writing a part of the second word to the memory array.

In yet another embodiment, a memory device includes: a plurality of memory cells that are configured to present a first word, wherein the first word comprises a plurality of data bits that form N−1 groups and a plurality of parity bits, corresponding to the first word, that form a first group attached to the N−1 groups, and wherein the first group of parity bits and the N−1 groups of data bits are each associated with a group index and N is a positive integer greater than 2; and a control logic circuit, coupled to the plurality of memory cells, and configured to: in response to a request to update the data bits of a first one of the N−1 groups, provide a second word comprising updated data bits that form a second one of the N−1 groups and a plurality of updated parity bits, corresponding to the second word, that form a second group, wherein the respective group indexes of the first one of the N−1 groups and the second group of updated parity bits are the same; and update part of the first word using the second word.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    retrieving a first word comprising a plurality of data bits and a plurality of original parity bits that correspond to the first word, wherein the plurality of data bits form N−1 groups and the plurality of original parity bits form a first group different from the N−1 groups, and N is a positive integer greater than 2;
    receiving a request to update respective data bits of a first one of the N−1 groups;
    providing a second word comprising updated data bits that form a second one of the N−1 groups and a plurality of updated parity bits that correspond to the second word, wherein the plurality of updated parity bits form a second group that has a same group index as the first one of the N−1 groups;
    reading the first word from a memory array;
    identifying respective group indexes of the first group and the first one of the N−1 groups;
    retrieving a plurality of corrected data bits from the plurality of data bits of the first word;
    removing corrected data bits of the first one of the N−1 groups from the plurality of corrected data bits; and
    inserting the updated data bits into the second one of the N−1 groups to provide a plurality of intermediate data bits.

2. The method of claim 1, wherein the first group and the second one of the N−1 groups have a same group index.

3. The method of claim 1, wherein a respective location of the plurality of updated parity bits within the second word is different from a respective location of the plurality of original parity bits within the first word.

4. The method of claim 3, further comprising:
    using respective tags of the first group and the N−1 groups to differentiate the first group from the N−1 groups.

5. The method of claim 4, wherein the tags each has a plurality of bits attached to either the respective plurality of data bits of each of the N−1 groups or the plurality of original parity bits of the first group.

6. The method of claim 5, further comprising:
    prior to retrieving the plurality of corrected data bits, removing the tag attached to the plurality of parity bits of the first group and rearranging the first group and N−1 groups.

7. The method of claim 1, further comprising:
    based on the plurality of intermediate data bits, providing the updated parity bits; and
    inserting the updated parity bits into the first one of the N−1 groups so as to provide the second word.

8. The method of claim 1, further comprising:
    writing a part of the second word that includes the second group and the second one of the N−1 groups to the memory array.

9. A method, comprising:
    reading a first word from a memory array, wherein the first word comprises a plurality of data bits that form N−1 groups and a plurality of original parity bits, corresponding to the first word, that form a first group attached to the N−1 groups, and wherein the first group of original parity bits and the N−1 groups of data bits are each associated with a group index and N is a positive integer greater than 2;

receiving a partial-write request to update the data bits of a first one of the N−1 groups;

providing a second word comprising updated data bits that form a second one of the N−1 groups and a plurality of updated parity bits, corresponding to the second word, that form a second group by corresponding group indexes of the second one of the N−1 groups and the second group to the group index of the first group of parity bits and the group index of the first one of the N−1 groups, respectively;

writing a part of the second word to the memory array;

identifying the respective group indexes of the first group and the first one of the N−1 groups;

retrieving a plurality of checked data bits that are corrected, if needed, from the plurality of data bits of the first word;

removing checked data bits of the first one of the N−1 groups from the plurality of checked data bits; and inserting the updated data bits into the second one of the N−1 groups to provide a plurality of intermediate data bits.

10. The method of claim 9, wherein a respective location of the plurality of updated parity bits within the second word is different from a respective location of the plurality of original parity bits within the first word.

11. The method of claim 9, further comprising:
reading respective tags of the first group and the N−1 groups to identify at least the respective group indexes of the first group and the first one of the N−1 groups.

12. The method of claim 11, wherein the tags each has a plurality of bits attached to either the respective plurality of data bits of each of the N−1 groups or the plurality of original parity bits of the first group.

13. The method of claim 12, further comprising:
prior to retrieving the plurality of checked data bits, removing the tag attached to the plurality of original parity bits of the first group and rearranging the first group and N−1 groups.

14. The method of claim 9, further comprising:
based on the plurality of intermediate data bits, providing the updated parity bits; and
inserting the updated parity bits into the first one of the N−1 groups so as to provide the second word.

15. A memory device, comprising:
a plurality of memory cells that are configured to present a first word,
wherein the first word comprises a plurality of data bits that form N−1 groups and a plurality of original parity bits, corresponding to the first word, that form a first group attached to the N−1 groups, and wherein the plurality of original parity bits and the N−1 groups of data bits are each associated with a group index and N is a positive integer greater than 2; and a control logic circuit, coupled to the plurality of memory cells, and configured to:
in response to a request to update the data bits of a first one of the N−1 groups, provide a second word comprising updated data bits that form a second one of the N−1 groups and a plurality of updated parity bits, corresponding to the second word, that form a second group, wherein the respective group indexes of the first one of the N−1 groups and the second group of updated parity bits are the same;
update part of the first word using the second word;
identify the respective group indexes of the first group and the first one of the N−1 groups;
retrieve a plurality of checked data bits that are corrected, if needed, from the plurality of data bits of the first word;
remove checked data bits of the first one of the N−1 groups from the plurality of checked data bits; and
insert the updated data bits into the second one of the N−1 groups to provide a plurality of intermediate data bits.

16. The memory device of claim 15, wherein the respective group indexes of the plurality of original parity bits and the second one of the N−1 groups are the same.

17. The memory device of claim 15, wherein a respective location of the plurality of updated parity bits within the second word is different from a respective location of the plurality of original parity bits within the first word.

18. The memory device of claim 15, wherein the control logic circuit is further configured to:
based on the plurality of intermediate data bits, provide the updated parity bits; and
insert the updated parity bits into the first one of the N−1 groups so as to provide the second word.

19. The memory device of claim 18, wherein the control logic circuit is further configured to:
write a part of the second word that includes the second group and the second one of the N−1 groups to the memory array.

20. The memory device of claim 15, wherein the control logic circuit is further configured to:
read respective tags of the first group and the N−1 groups to identify at least the respective group indexes of the first group and the first one of the N−1 groups, wherein the tags each has a plurality of bits attached to either the respective plurality of data bits of each of the N−1 groups or the plurality of original parity bits of the first group; and
prior to retrieving the plurality of checked data bits, remove the tag attached to the plurality of original parity bits of the first group and rearranging the first group and N−1 groups.

* * * * *